United States Patent
Lessmöllmann et al.

(10) Patent No.: US 6,660,151 B1
(45) Date of Patent: *Dec. 9, 2003

(54) MICROSTRUCTURE ELEMENTS AND PROCESS FOR THE PRODUCTION THEREOF

(75) Inventors: Christoph Lessmöllmann, Gernsbach (DE); Joachim Eicher, Karlsruhe (DE); Holger Reinecke, Dortmund (DE)

(73) Assignee: STEAG MicroParts GmbH, Dortmund (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1208 days.

(21) Appl. No.: 08/576,367

(22) Filed: Dec. 21, 1995

Related U.S. Application Data

(62) Division of application No. 08/208,296, filed on Mar. 10, 1994, now Pat. No. 5,501,784.

(30) Foreign Application Priority Data

Mar. 12, 1993 (DE) .......................................... 43 07 869

(51) Int. Cl.⁷ ............................. B29C 33/38; C25D 1/00
(52) U.S. Cl. ............................. 205/50; 264/219; 205/67
(58) Field of Search ............................. 205/67, 70, 50; 264/219, 2.5

(56) References Cited

U.S. PATENT DOCUMENTS

| | | | | |
|---|---|---|---|---|
| 3,993,515 A | * | 11/1976 | Reichert | 156/3 |
| 4,759,887 A | * | 7/1988 | Geissler et al. | 264/25 |
| 4,793,953 A | * | 12/1988 | Maus | 264/2.5 |
| 5,244,143 A | * | 9/1993 | Ference et al. | 228/180.21 |
| 5,348,616 A | * | 9/1994 | Hartman et al. | 156/643 |
| 5,358,909 A | * | 10/1994 | Hashiguchi et al. | 437/228 |
| 5,415,977 A | * | 5/1995 | Wuensch et al. | 430/326 |
| 5,470,651 A | * | 11/1995 | Milinkovic et al. | 428/325 |
| 5,702,810 A | * | 12/1997 | Koseki et al. | 428/318.8 |

* cited by examiner

Primary Examiner—Roy King
Assistant Examiner—William T. Leader
(74) Attorney, Agent, or Firm—Oblon, Spivak, McClelland, Maier Neustadt, P.C.

(57) ABSTRACT

A microstructured mold is produced from a solid body (metal, ceramic, glass, stone or monocrystalline material) by precision mechanical machining, additive or subtractive structuring. The mold insert is filled and covered by a flowable material and the solidified material is separated from the mold insert giving a microstructure element. The microstructure elements produced by the process have good material properties and can be prepared in a broad range of shapes and structures.

14 Claims, 2 Drawing Sheets

MICROSTRUCTURE ELEMENTS AND PROCESS FOR THE PRODUCTION THEREOF

This is a Division of application Ser. No. 08/208,296 filed on Mar. 10, 1994, now U.S. Pat. No. 5,501,784.

BACKGROUND OF THE INVENTION

1. Field of the Invention

The invention relates to microstructure elements and to a process for the production of microstructure elements from a metal, plastic or sintered material.

2. Discussion of the Background

Microstructure elements have dimensions in the micron range; they are required, in particular, in precision engineering, micromechanics, microoptics and microelectronics, for example as sensor elements, actuator elements or components in fluid or electronic systems. They are generally employed where properties such as low bulk, low weight and inexpensive manufacture are required. The invention has the object of providing microstructure elements of this type in an economic manner.

It is known that microstructure elements can be produced from plastic, metal or ceramic by the LIGA process by lithography, electroforming and casting. See Kernforschungs-zentrum Karlsruhe, Report 3995 (1985). Plastic microstructure elements are obtained inexpensively and in large numbers by multiple casting from a metallic mold insert by reaction injection molding or injection molding.

The primary structure is obtained by imagewise irradiation of a radiation-sensitive plastic with X-rays or synchrotron radiation, followed by dissolution of the irradiated (or unirradiated) areas of the plastic. The mold insert is produced by electrodeposition of metal in the pre-dissolved areas of the primary structure. The structure of the mold insert is complementary to the primary structure. In spite of all the advantages offered by the LIGA process, such as, for example, substantial geometric freedom in a plane and the wide variety of materials that can be employed, simpler processes are desired in many cases.

It is furthermore known that crystalline materials can be structured by anisotropic etching (Proceedings of the IEEE, Vol. 70 (1982), No. 5, and IEEE Trans. Electron. Devices (ED-25 (1978), No. 10, 1178–1185)). The resultant microstructure elements can only rarely be used directly, since the etched material does not satisfy certain requirements—for example adequate breaking strength.

SUMMARY OF THE INVENTION

One object of the invention, therefore, is to produce microstructure elements from a metal, plastic or sintered material by casting from a mold insert less expensively and more rapidly and to extend the range of structural shapes which can be achieved at acceptable expense.

This object is achieved according to the invention by (a) producing a microstructured mold insert (primary structure) having at least one cavity open on one surface thereof from a solid body by precision mechanical machining, additive structuring or subtractive structuring;

(b) filling and covering the primary structure with a flowable material;

(c) solidifying the flowable material; and (d) separating the solidified flowable material from the microstructured mold insert, giving the metal, plastic or sintered material microstructure element, whose structure is complementary to the primary structure.

DETAILED DESCRIPTION OF THE PREFERRED EMBODIMENTS

Figure 1A:
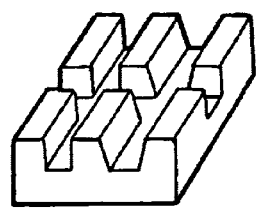
FIGS. 1a, 1b and 1c are angled views of three embodiments of the primary structure or microstructured mold insert of the process of the invention.

The process of the present invention allows one to prepare a variety of microstructures which have the same structure as an initial microstructured mold (the primary structure) or which are complementary to this initial mold. The mechanical machining processes as well as the additive structuring and subtractive structuring processes are conducted by processes well known in the art. Similarly, the filling of the primary structure with a flowable material is conducted using conventional filling processes such as reaction-injection molding processes. The separation of complementary microstructure elements is conducted by physically separating the elements (lifting-off) or may be conducted using conventional dissolution methods.

The primary structure is produced from metal (for example brass, aluminum or steel), ceramic (for example aluminum oxide, porcelain or hard metal), glass (for example borosilicate glass, calcium fluoride glass, lithium fluoride glass or lithium niobate glass), stone (for example precious stones such as sapphire, ruby or topaz), plastics (for example thermoplastics, reaction-curable resins) or a combination of these materials (for example a laminate consisting of a metallic support and a plastic layer)—preferably from silicon, brass, quartz, gallium arsenide, germanium, polysulfone or polymethylmethacrylate—by precision mechanical machining, such as sawing, grinding, milling or drilling, if appropriate using diamond tools, laser machining, diamond machining or other precision methods. The solid body can be structured further by additive structuring, i.e. by imagewise application of material—preferably by physical or chemical deposition from the vapor phase (PVD or CVD). Monocrystalline material—such as silicon, quartz or germanium—can be structured by subtractive structuring, i.e. by imagewise removal of material, preferably by anisotropic etching or ion etching. Depending on the properties of the solid body on which the primary structure is to be produced, two of these three methods or all three methods can be combined with one another.

Suitable flowable materials for filling and covering the primary structure are reaction-curable resins, which are solidified by curing, or molten plastics, which are solidified by cooling. It is also possible to use a pulverulent material—preferably a metal, ceramic, glass or plastic powder—or a slip composition containing one of these powders. The pulverulent material or the slip composition is solidified by drying, sintering or firing.

The solidified flowable material is separated from the primary structure by lifting off the primary structure or by selective dissolution of the primary structure. This gives a metal, plastic or sintered material microstructure element whose structure is complementary to the primary structure.

Precision mechanical removal of the layer covering the primary structure gives a metal, plastic or sintered material microstructure element with through-apertures (holes). Depending on the structural shape, the covering layer can be removed from the primary structure before or after the separation of the solidified flowable material. To produce a metal microstructure element whose structure corresponds to the primary structure, the layer covering the primary structure is removed, after the flowable, non-electroconductive material has solidified, as far as the front face of the primary structure by precision mechanical machining. A top layer is then applied which is in contact with the front face of the primary structure. This top layer comprises a conductive material, for example conductive plastic or metal, or a laminate; the front face of the primary structure is covered by a thin metal layer, on top of which is a thick plastic layer. The solidified flowable material, together with the top layer, is then separated from the primary structure—preferably by lifting—giving the secondary structure, which is complementary to the primary structure. This secondary structure is filled or covered by an electrodeposited or chemically deposited metal such as nickel, copper or gold. The microstructured layer is separated from the secondary structure—preferably by lifting—giving the metallic microstructure element, whose structure corresponds to the primary structure, but comprises a different metal than the primary structure.

This metallic microstructure element can be used as such or used (as a tertiary structure) for casting microstructure elements whose structure is complementary to the primary structure.

For producing the primary structure, a material is selected whose properties satisfy the demands of the stated structuring process as fully as possible. These include very low-burr structurability during precision mechanical machining, mirror-smooth surfaces of the resultant microstructures, very high material homogeneity and purity, adequate dimensional stability aid mechanical strength for the structuring and subsequent process steps, and selective etchability with respect to the other substances present during etching.

Particularly suitable are comparatively thick sheets of a monocrystalline material—preferably made from silicon, quartz, gallium arsenide or germanium—which are employed in large amounts in microelectronics, are readily available and are inexpensive. In addition, sheets or, if desired, other elements (such as cylinders) made of glass, ceramics, stone or other metals are also suitable if they satisfy the requirements of the intended structuring method.

For stability reasons, preference is given to sheets with a thickness of about 2 mm or more which are structured on one side in the above-mentioned manner. If the primary structure is later to be separated from the secondary structure or the microstructure element by lifting, the primary structure must be free from undercuts, narrowing cavities, burrs and rough side surfaces, since this makes lifting off more difficult or impossible. If the primary structure contains undercuts or narrowings, the primary structure is dissolved and thus separated from the secondary structure.

The primary structure is preferably filled and covered by means of a thermoplastic or a reaction-curable resin. Suitable thermoplastics include $C_{1-8}$ alkyl(meth)acrylate resins. Particularly suitable is polymethyl methacrylate, due to its good flow properties and its adequate chemical and mechanical stability for the subsequent process steps. Further suitable thermoplastics are for example polysulfone, polyethylene and polypropylene. Even reaction-curable resins for example based on polyamide, polyimide, polypyrrole or polymethylmethacrylate are suitable.

Pulverulent flowable material or a slip composition is poured or mechanically pressed into the primary structure, if necessary with application of a vaccum. Sinterable pulverulent materials are for example metal powders (such as ferrous alloys, alloys of tin and zinc or copper-containing alloys), ceramic powders (such as zirconium oxide, aluminum oxide or zirconium oxide strengthened cordierite) or glass powders (such as sodium-calcium-silicate or a glass powder produced by the sol-gel-process).

The layer covering the primary structure enables or simplifies the separation operation and may be a constituent of the microstructure element containing cavities open on one side. In one embodiment, mechanical removal of the top layer gives microstructure elements with through-apertures, such as sieve and net structures. In another embodiment, the layer covering the primary structure is removed mechanically, and a layer of electroconductive material is applied if the microstructure made from solidified flowable material is subsequently to be recopied, for example by electroforming, to give a metallic microstructure. For the electroforming of microstructures having a large aspect ratio, cavities whose side walls are non-conductive are generally required, so that the electrodeposited metal only grows up from the conductive base layer. Other structural shapes such as pyramid structures—are also completely filled by electroforming in the case of conductive side walls.

The conductive layer comprises, for example, a conductive plastic, adhesive or metal. Conductive thermoplastics may contain a filler which is conductive; these are converted, for example, to sheets which are welded or adhesively bonded to the solidified flowable material filling the cavities of the primary structure. Plastics having intrinsic conductivity, for example polypyrrole, polyacetylene and polythiophene, can likewise by used as the conductive layer.

A conductive layer of metal is produced, for example, by vapor-deposition with metal at relatively low temperatures. Electroforming only requires a very thin metal layer, which is easy to produce by vapor deposition.

In order to improve the mechanical stability, the thin metal layer is adhesively bonded, for example, to a plastic plate or reinforced by electrodeposition of metal.

The conductive top layer must have direct contact with the front faces of the primary structure to give cavities having a conductive base layer after the separation operation.

In order to separate the primary structure from the solidified flowable material, it is possible in the case of many structures to lift the solidified flowable material off the primary structure, in particular if the solidified flowable metal has sufficient inherent stability, only adheres weakly to the primary structure and has no undercuts or narrowings. In separation of this type, the primary structure is retained and can be refilled and covered with flowable material, i.e. it can be used repeatedly for the production of microstructure elements or for the production of the secondary structure.

On the other hand, the primary structure can be separated from the solidified flowable material by chemical dissolution of the primary structure, which is then lost. Primary structures of crystalline material are attacked by basic etchants or salts to which many metals and plastics are resistant.

Sodium hydroxide solution and potassium hydroxide solution are suitable etchants for silicon. Sodium hydroxide solution containing hydrogen peroxide is a suitable etchant for gallium arsenide. Ammonium bifluoride is a suitable etchant for quartz, and a mixture of hydrogen peroxide and phosphates is a suitable etchant for germanium. For complete dissolution of silicon, an 18% strength potassium hydroxide solution at 70° C., for example, is suitable. Polymethyl methacrylate and metals are resistant to this solvent.

A secondary structure having a conductive base layer or base plate can be copied again by electroforming, giving a metallic microstructure element whose structure corresponds to the primary structure, but which comprises a different metal than the primary structure. This element may be the desired end product. On the other hand, this microstructure (tertiary structure) can be used as a mold insert for repeated casting of a microstructure element whose structure is complementary to the primary structure. Some of the process steps indicated can be interchanged, allowing the process sequence to be varied.

The process according to the invention and the microstructure elements produced by the process have the following advantages:

(1) In the simple case, the production of a microstructure element requires only two essential process steps, namely structuring of the solid body by precision machining, additive structuring or subtractive structuring, and the filling and covering of the primary structure with a flowable material.

(2) The process is carried out without deep X-ray lithography; extended, expensive irradiation times are thus unnecessary.

(3) For the production of the primary, secondary or tertiary structure, materials are selected which are ideal for these process steps; requirements of the microstructure elements are not taken into account here.

(4) For the microstructure elements, materials are selected which ideally satisfy the requirements of these elements; requirements made during the production of the primary, secondary or tertiary structure have no further effect.

(5) The microstructures can have different heights from area to area.

(6) In addition to the structural shapes obtainable by deep X-ray lithography, other shapes which can be produced rapidly and inexpensively are accessible.

(7) Microstructures having mutually inclined or curved walls can be produced simply and at little cost.

(8) The volume shrinkage which may occur on the solidification of the flowable material is compensated by the top layer on the primary or secondary structure.

Figure 1B:
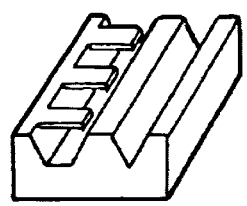
Figure 1C:
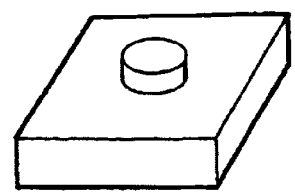
Figure 2A:
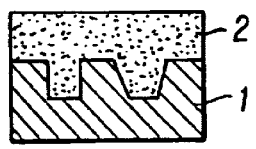
FIGS. 2a, 2b and 2c show cross sections of the primary structures of FIGS. 1a, 1b and 1c after the primary structures have been filled with a flowable material and solidified.
Figure 2B:
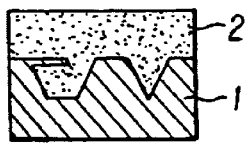
Figure 2C:
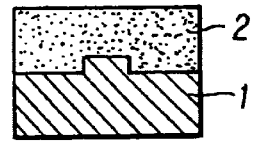
Figure 3A:
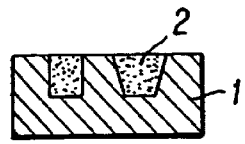
FIGS. 3a, 3b and 3c show cross sections of the structures of FIGS. of 2a, 2b and 2c after the flowable material has been removed down to the face of the primary structure.
Figure 3B:
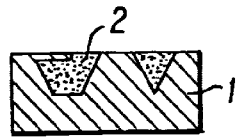
Figure 3C:
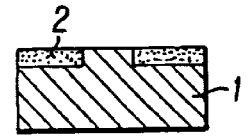
Figure 4A:
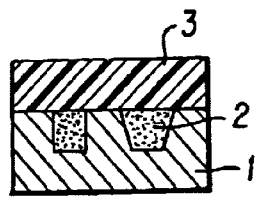
FIGS. 4a, 4b and 4c show structures obtained after the structures of FIGS. 3a, 3b and 3c have been covered with a conductive layer or laminate having a conductive layer.

FIG. 1 shows three examples, each in an angled view, of the primary structure (microstructure) produced from a solid body. The primary structure in FIG. 1a is obtained by precision mechanical machining, that in FIG. 1b by subtractive structuring and that in FIG. 1c by additive structuring. FIGS. 2a, 2b and 2c show a cross-section through the primary structure (1) which has been covered and filled with a flowable material (2) and can subsequently be machined further in various ways. On the one hand, the top layer can be removed as far as the front face of the primary structure, giving the primary structures (1) filled with flowable material (2) shown in FIGS. 3a, 3b and 3c. Covering with a conductive layer gives the structures shown in FIGS. 4a, 4b and 4c. FIG. 4a shows a relatively thick top layer (3) of conductive plastic, FIG. 4b shows a laminate comprising a thin metal layer (4) directly on the front face of the primary structure and a relatively thick layer (5) of non-conductive plastic on top of the metal layer, and FIG. 4c shows a relatively thick metal layer (6).

Figure 4B:
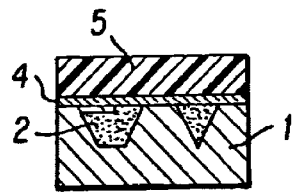
Figure 4C:
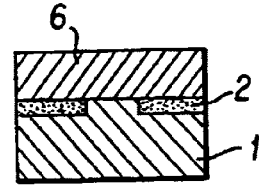

The primary structure is then separated from the secondary structure, in the case of the structures in FIGS. 4a and 4c, for example, by lifting, in the case of the structure in FIG. 4b, for example, by dissolution of the primary structure. This gives the secondary structures shown in FIGS. 7a, 7b and 7c, having conductive layers (3), (4) or (6) on the front face of the primary structure, and the structured solidified flowable material (2), which has filled the cavities of the primary structure. In FIG. 7b, the thin conductive layer (4) is reinforced by a relatively thick layer (5).

If the primary structure can be lifted off the secondary structure, the primary structure can be used repeatedly for the production of the secondary structure.

Figure 7A:
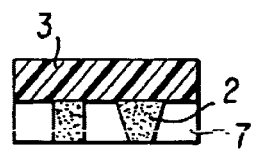
FIGS. 7a, 7b and 7c show secondary structures in cross section obtained by lifting or dissolving the primary structure shown in FIGS. 4a, 4b and 4c from the conductive layers.
Figure 7B:
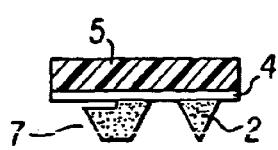
Figure 7C:
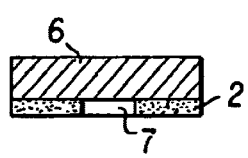
Figure 8A:
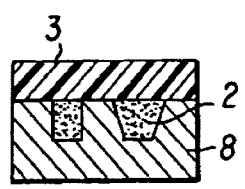
FIGS. 8a, 8b and 8c show structures in cross section obtained by covering the structures of FIGS. 7a, 7b and 7c with a metal layer.
Figure 8B:
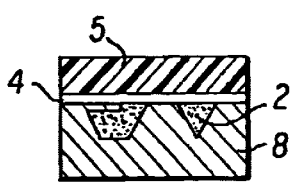
Figure 8C:
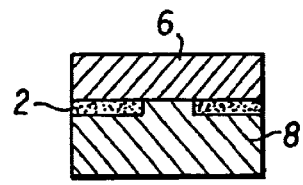

The cavities (7) of the secondary structures in FIGS. 7a, 7b and 7c are filled and covered with metal (8), for example by electroforming; FIGS. 8a, 8b and 8c show the layer sequence.

Figure 9A:
FIGS. 9a, 9b and 9c show metal microstructures obtained by removing the conductive layers shown in FIGS. 8a, 8b and 8c.
Figure 9B:
Figure 9C:

The metal microstructure is separated from the secondary structure, to give the metal microstructure elements shown in FIGS. 9a, 9b and 9c. The structures shown in FIGS. 8a and 8c can be separated by lifting-off. In the case of the structure in FIG. 8b, the two top layers (4) and (5) and the solidified flowable material (2) originating from the primary structure are dissolved.

The metallic microstructure elements according to the invention shown in FIGS. 9a, 9b and 9c are used directly or serve as a mold insert for casting of complementary microstructure elements, for example in FIGS. 9a and 9c.

Figure 5A:
FIGS. 5a, 5b and 5c show secondary structures which are obtained by separating the primary structure of FIGS. 2a, 2b and 2c from the solidified flowable material.
Figure 5B:
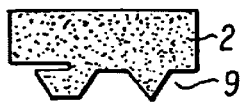
Figure 5C:
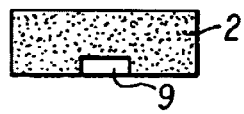

On the other hand, the structures shown in FIGS. 2a, 2b and 2c can be separated from one another, giving the structures of solidified flowable material (2) shown in FIGS. 5a, 5b and 5c. In order to separate the composite element shown in FIG. 2b, the solid body (1) forming the primary structure is dissolved.

The plastic or sintered material microstructures shown in FIGS. 5a, 5b and 5c and the metal or sintered material microstructures shown in FIGS. 9a, 9b and 9c have cavities (9) open on one side and are microstructure elements according to the invention.

Figure 6A:
FIGS. 6a, 6b and 6c show microstructures obtained by removing the solidified flowable material from the microstructures of FIGS. 5a, 5b and 5c to form microstructures having through-apertures.
Figure 6B:
Figure 6C:
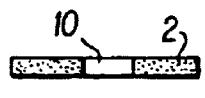

Furthermore, the top layer of solidified flowable material can be removed mechanically from the microstructures in FIGS. 5a, 5b and 5c, giving the microstructure elements according to the invention shown in FIGS. 6a, 6b and 6c, which, in the example shown here, comprise plastic or sintered material, with through-apertures (10).

Other features of this invention will become apparent in the course of the following description of an exemplary embodiment which is given for illustration of the invention and is not intended to be limiting thereof.

EXAMPLE

A nickel microstructure element with cavities open on one side is produced, for example, as follows.

A polished sheet of silicon (thickness 2 mm, diameter 100 mm) is structured by sawing using a 70 µm thick diamond saw blade. The microstructure comprises square columns; (140 µm wide in each direction, 600 µm high). The circular sheet is subsequently divided into a plurality of rectangular pieces by means of a coarser saw blade.

The silicon sheet containing the primary structure is cleaned and adhesively bonded to a metal support, which is installed in the mold of a reaction-injection molding machine. The primary structure is completely filled with polymethyl methacrylate plastic with application of a vacuum and covered with an approximately 2 mm thick layer; the plastic cures completely within a few minutes.

The metal support containing the bonded-on and filled primary structure is removed from the molding machine. The layer covering the primary structure is removed by milling, exposing the front face of the silicon sheet.

A conductive layer of titanium and titanium dioxide is vapor-deposited on the front face of the structured silicon sheet and provided with a contact wire. A support plate of polymethyl methacrylate is adhesively bonded to the conductive layer. The primary structure is separated from the secondary structure by lifting-off.

Nickel is electrodeposited in the cavities of the secondary structure—starting from the conductive layer on the base of each cavity. The nickel-filled cavities are covered with a nickel layer with a thickness of several millimeters as a shape-stable support layer. The secondary structure is separated from the nickel microstructure element by lifting-off. This secondary structure is used to produce further microstructure elements from plastic.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A process for the production of a microstructured element, comprising the steps of:
   (a) forming a microstructure of a microstructured mold having an open cavity on one surface thereof from a solid body by mechanical machining, additive structuring or subtractive structuring, wherein said mold consists essentially of ceramic, glass, stone, quartz, gallium arsenide, germanium or a mixture thereof;
   (b) filling the cavity and covering the microstructured mold with a flowable plastic or sinterable material;
   (c) solidifying the flowable material which has filled and covered the microstructured mold; and
   (d) separating the solidified flowable material form the mold to provide a plastic or sintered material element having a microstructure complementary to the microstructured mold.

2. The process of claim 1, wherein said mold comprises metal, ceramic, glass or stone.

3. The process of claim 1, wherein said mold comprises silicon, quartz, gallium arsenide or germanium.

4. The process of claim 3, wherein said mold comprises quartz or germanium and said mold is formed by anisotropic etching or ion etching.

5. The process of claim 1, wherein said mold is prepared by additive structuring, wherein said additive structuring is physical or vapor deposition onto said solid body.

6. The process of claim 1, wherein said flowable material is a reaction-curable resin and said solidifying occurs by curing said reaction-curable resin.

7. The process of claim 1, wherein said flowable material is a molten plastic and said solidifying occurs by cooling.

8. The process of claim 1, wherein said flowable material is ceramic or glass powder or a slip composition thereof and said solidifying occurs by drying, sintering or firing.

9. The process of claim 1, wherein said separating step comprises physically lifting said solidified flowable material from said mold.

10. The process of claim 1, wherein said separating step comprises selective dissolution of said mold.

11. The process of claim 1, further comprising:
    (e) removing a portion of said plastic or sintered material from said microstructured element having a microstructure complementary to said mold to produce a second microstructured element having apertures extending through said second element.

12. The process of claim 11, wherein said second element does not have protrusions, undercuts or cavities.

13. The process of claim 1, further comprising:
    (e) removing a portion of said plastic or sintered material from said element having a structure complementary to said mold to produce a second element having protrusions, cavities, undercuts or combination thereof, but not holes or perforations in said second element.

14. A microstructural element produced by a process comprising the steps of:
    (a) forming a microstructure of a microstructured mold having an open cavity on one surface thereof from a solid body by mechanical machining, additive structuring or subtractive structuring, wherein said mold consists essentially of ceramic, glass, stone, quartz, gallium arsenide, germanium or a mixture thereof;
    (b) filling the cavity and covering the microstructured mold with a flowable electrically non-conductive material;
    (c) solidifying the flowable electrically non-conductive material to form a solid layer in contact with the surface of the microstructured mold and filling the cavity;
    (d) removing a portion of the solid layer to expose the surface of the microstructured mold and the cavity filling with solidified flowable material;
    (e) applying a layer of conductive material to and covering the exposed surface of the mold and filled cavity;
    (f) separating the conductive layer and solidified flowable material in the cavity from the mold to provide a microstructure having a shape complementary to the mold;
    (g) electrodepositing a metal layer on the complementary microstructure; and
    (h) separating the metal layer from the complementary structure to provide a metallic microstructured element.

* * * * *